United States Patent [19]
Kansy

[11] 3,945,099
[45] Mar. 23, 1976

[54] METHOD AND APPARATUS FOR MAKING A SURFACE WAVE TRANSDUCER DEVICE

[75] Inventor: Robert Kansy, Fort Wayne, Ind.

[73] Assignee: University of Illinois Foundation, Champaign, Ill.

[22] Filed: June 6, 1975

[21] Appl. No.: 584,489

Related U.S. Application Data
[62] Division of Ser. No. 430,030, Jan. 2, 1974.

[52] U.S. Cl. .................. 29/25.35; 310/9.5; 310/9.8; 333/30 R; 333/72
[51] Int. Cl.² ........................................ H01L 41/22
[58] Field of Search............ 29/25.35; 333/30 R, 72; 310/8.1, 9.5, 9.7, 9.8

[56] References Cited
UNITED STATES PATENTS

| | | | |
|---|---|---|---|
| 3,571,632 | 3/1971 | de Jong................................ | 310/9.5 |
| 3,766,615 | 10/1973 | Shimizu............................ | 29/25.35 |
| 3,821,667 | 6/1974 | Thomann.......................... | 333/30 R |
| 3,839,687 | 10/1974 | Subramanian .................... | 333/30 R |

Primary Examiner—Carl E. Hall
Attorney, Agent, or Firm—Martin Novack

[57] ABSTRACT

A ferroelectric surface wave transducer device comprising an unpoled ferroelectric substrate having a substantially sinusoidal poled region at a surface thereof. A metal plate electrode is disposed on the opposing surface of the substrate. In operation an A.C. voltage applied across the two electrodes gives rise to a surface elastic wave in the substrate. Also disclosed is a method of producing a surface wave transducer of the type described. A pair of interdigitated metal electrodes are applied to a surface of an unpoled ferroelectric substrate. A poling potential is applied between the electrodes, preferably while the substrate is heated. The interdigitated electrodes are then removed and a metal plate electrode is applied over the region where the interdigitated electrodes had been. Finally, another metal electrode is applied to the opposite surface of the substrate. In a preferred embodiment of the invention the interdigitated electrodes are in the form of a moveable fixture. The fixture is moved into contact with an unpoled substrate of ferroelectric material and, after the poling potential is applied, it is moved out of contact with the substrate. In this manner the fixture can be used repeatedly to selectively pole ferroelectric substrates upon which simple plate electrodes are then applied.

5 Claims, 9 Drawing Figures

METHOD AND APPARATUS FOR MAKING A SURFACE WAVE TRANSDUCER DEVICE

This is a division of application Ser. No. 430,030, filed Jan. 2, 1974.

BACKGROUND OF THE INVENTION

This invention relates to surface wave devices and, more particularly, to a surface wave transducer fabricated on ferroelectric materials and a method and apparatus for making same. The subject matter of this application is related to subject matter disclosed in the copending application Ser. No. 430,149 entitled "Variable Delay Device" filed of even date herewith and assigned to the same assignee as the present application.

Ferroelectric materials generally exhibit characteristics of both ferroelectricity and piezoelectricity. However, ceramic ferroelectric materials, such as barium titanate and lead titanate zirconate, exhibit little or no piezoelectric effect unless they are first "poled." It is believed that the absence of piezoelectricity in these materials is due to the nature of their "ferroelectric domain" structure. Specifically, each domain can be thought of as having its own intrinsic polarization direction with the directions being essentially random. When an electric field is applied to the material a particular domain may be elongated while its neighboring domain, whose spontaneous polarization direction is of opposite sense, will be contracted. The result is that the overall material exhibits little net piezoelectricity.

It is well known that polycrystalline ferroelectric ceramics can be rendered piezoelectric by reorienting the material's domains in the same direction; i.e., by "poling." The common technique of poling is to apply a strong electric field to the material for a relatively long period, usually at an elevated temperature.

After a ferroelectric material has been poled, a surface wave device can be fabricated by forming transducers thereon which are capable of converting electric signals into surface elastic waves or vice versa. A particularly efficient transducer comprises a pair of interdigitated comb-like metal electrodes which are generally formed on the ceramic substrate surface using photolithographic techniques. When a voltage is applied to the electrodes the resultant electric field between each pair of adjacent fingers gives rise to an elastic wave which propagates along the material's surface. The fingers of the comb electrodes have spacings selected such that the waves generated by each finger pair add coherently. Similarly, a travelling elastic wave gives rise to a varying electric field which can be sensed with interdigitated electrodes acting as a receiver.

It has recently been demonstrated that interdigitated electrodes can be formed on the surface of an unpolarized ferroelectric material and the region below the electrodes poled by applying a strong D.C. field across the electrodes. After this "selective" poling is achieved, the electrodes are used to excite surface acoustic waves in the material. In such case, the attained polarization is of the same pattern as the electric field used for exciting surface waves.

The above-described techniques, while useful and operative, include various inherent disadvantages. For example, the photolithographic techniques employed to form the small delicate electrode fingers involve undue time and expense. Also, once the interdigitated electrodes are formed, tiny geometries limit the voltage level which can be applied during device operation. More specifically, since the electric fields applied across the electrodes extend into the environment above the substrate, such fields are limited by the dielectric strength of air if breakdown is to be avoided.

It is an object of this invention to provide improvements in the art which are responsive to the stated problems among others.

SUMMARY OF THE INVENTION

The present invention is directed to a novel ferroelectric surface wave transducer device. In accordance with the invention there is provided an unpoled ferroelectric substrate having a substantially sinusoidal poled region at a surface thereof. A metal plate electrode is disposed over the poled region and a second metal electrode is disposed on the opposing surface of the substrate. In operation, an A.C. voltage applied across the two electrodes gives rise to a surface elastic wave in the substrate.

The invention is also directed to a novel method of producing a surface wave transducer of the type described. A pair of interdigitated metal electrodes are applied to a surface of an unpoled ferroelectric substrate. A poling potential is applied between the electrodes, preferably while the substrate is heated. The interdigitated electrodes are then removed and a metal plate electrode is applied over the region where the interdigitated electrodes had been. Finally, another metal electrode is applied to the opposite surface of the substrate.

In a preferred embodiment of the invention the interdigitated electrodes are in the form of a moveable fixture. The fixture is moved into contact with an unpoled substrate of ferroelectric material and, after the poling potential is applied, it is moved out of contact with the substrate. In this manner the fixture can be used repeatedly to selectively pole ferroelectric substrates upon which simple plate electrodes are then applied. Thus, the need for photolithographically applying interdigited electrodes to the substrate surface is obviated.

Further features and advantages of the invention will become more readily apparent from the following detailed description when taken in conjunction with the accompanying drawings.

DESCRIPTION OF THE PREFERRED EMBODIMENT

Figure 1:
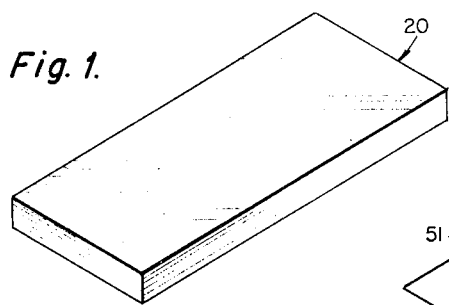
FIGS. 1 to 4 illustrate a sequence of steps comprising a method of making a surface wave transducer device in accordance with the invention.
Figure 2:
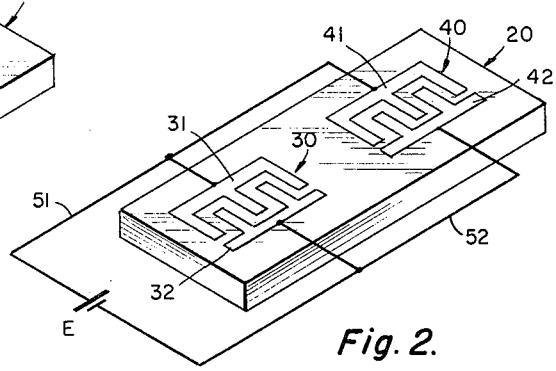
Figure 3:
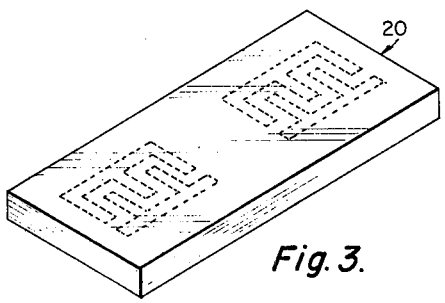
Figure 4:
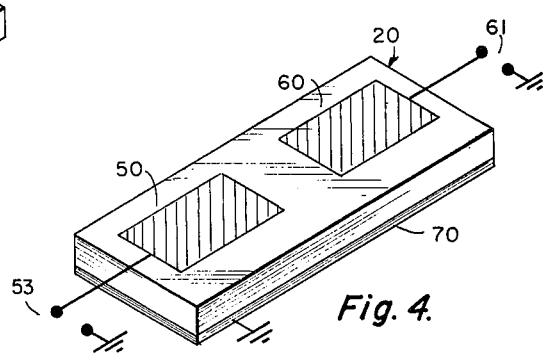

Referring to FIGS. 1 through 4, there is illustrated a sequence of steps comprising a method of making a surface wave transducer device in accordance with the invention. An unpolarized wafer of ferroelectric material, such as a ceramic lead zirconate titanate substrate 20, is shown in FIG. 1. Other suitable substrate materials, such a barium titanate, could also be employed, depending on selection of particular desired properties for the ultimately formed device. FIG. 2 shows the substrate 20 with a pair of interdigitated electrode pairs 30 and 40 disposed thereon. The preferred form of these electrode pairs will be described hereinbelow, it sufficing for the present to note that the electrode pair 30 consists of a metal "comb" electrode 31 having "fingers" which are interdigitated with the fingers of a metal comb electrode 32 and electrode pair 40 consists of a metal comb electrode 41 having fingers which are interdigitated with the fingers of metal comb electrode 42. A conductor 51 is coupled to the electrodes 31 and 41 and another conductor 52 is coupled to the electrodes 32 and 42. A D.C. poling potential E is applied between the conductors 51 and 52 under conditions to be described below. The electrode pairs 30 and 40 are then removed from the substrate 20 and FIG. 3 shows, in dashed lines, the outline of the poling patterns formed near the surface of substrate 20 in the regions where the electrode pairs had been. A pair of metal plate electrodes, designated 50 and 60, are then deposited over the poled regions and another metal electrode 70 is formed on the entire opposite surface of substrate 20. This is shown in FIG. 4 which also depicts input and output terminals 53 and 61 that are respectively coupled to the plate electrodes 50 and 60. Electrode 70 is coupled to ground reference potential.

When an A.C. voltage is applied at terminal 53 (with respect to ground) a surface elastic wave is generated under the plate electrode 50. This wave is received under the plate electrode 60 where it is transduced back to an electrical signal which can be measured at the terminal 61. Thus, the device shown in FIG. 4 can be employed as a delay line with the delay time depending on the propagation velocity of the surface wave in the substrate 20. The device of FIG. 4 includes two transducers made in accordance with the invention and such transducers are suitable for use in many surface wave device applications such as filters or modulators among others.

Figure 5:
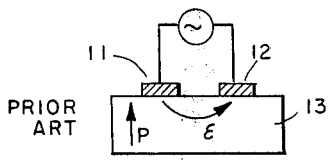
FIGS. 5 to 7 are simplified cross-sections of transducers which are helpful in describing the theory of operation of the invention.
Figure 6:
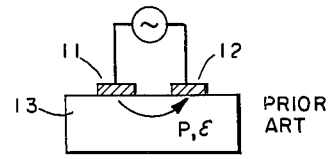
Figure 7:
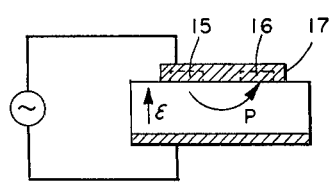

The theory of operation of the present transducer is illustrated in simplified terms with the aid of FIGS. 5, 6 and 7. FIGS. 5 and 6 represent simplified cross-sections of prior art devices and FIG. 7 represents a simplified cross-section of a transducer in accordance with the invention. In FIG. 5 there is shown a pair of adjacent electrode fingers 11 and 12 deposited on a substrate 10 which had been previously poled uniformly in the direction indicated by the arrow labelled "P." When an A.C. voltage is now applied across the fingers, the resultant (instantaneous) electric field is represented by the curved arrow labelled "ε." This is the conventional case wherein an elastic surface wave is generated by virtue of the varying components of electric field in the direction of poling. In the case of FIG. 6 prior art, a ceramic ferroelectric substrate 13 is poled by applying a D.C. voltage (not shown) across the fingers 11 and 12 to obtain a localized poling pattern which is substantially sinusoidal in shape and indicated by the curved arrow labelled P. During operation A.C. voltage is applied across the fingers, as shown, and the instantaneous electric field is indicated by the same curved arrow which is also labelled ε. FIG. 7 illustrates the situation of the invention and shows, by dotted area, positions which adjacent fingers 15 and 16 had occupied during poling (as per FIG. 2). Thus, a localized poling pattern is indicated by the curved arrow labelled P. During operation an A.C. voltage is applied between the plate electrode 17 and the bottom electrode 18 and the (instantaneous) electric field is indicated by the arrow labelled ε. Thus, the relationship between the poling pattern and the electric field is the opposite of that illustrated in FIG. 5. Again, however, an elastic surface wave is generated by virtue of the varying components of electric field in the direction of poling. IN FIG. 7 the poling pattern resulting from only a single finger pair is shown, but it will be understood that comb electrodes having multiple fingers (e.g. FIG. 2) are preferably employed during manufacture to achieve an extended sinusoidal poling pattern. In such case the fingers of the comb electrodes have spacings selected such that the poling pattern under the plate electrode gives rise (for a particular excitation frequency) to waves generated by each finger pair which add coherently.

Figure 8:
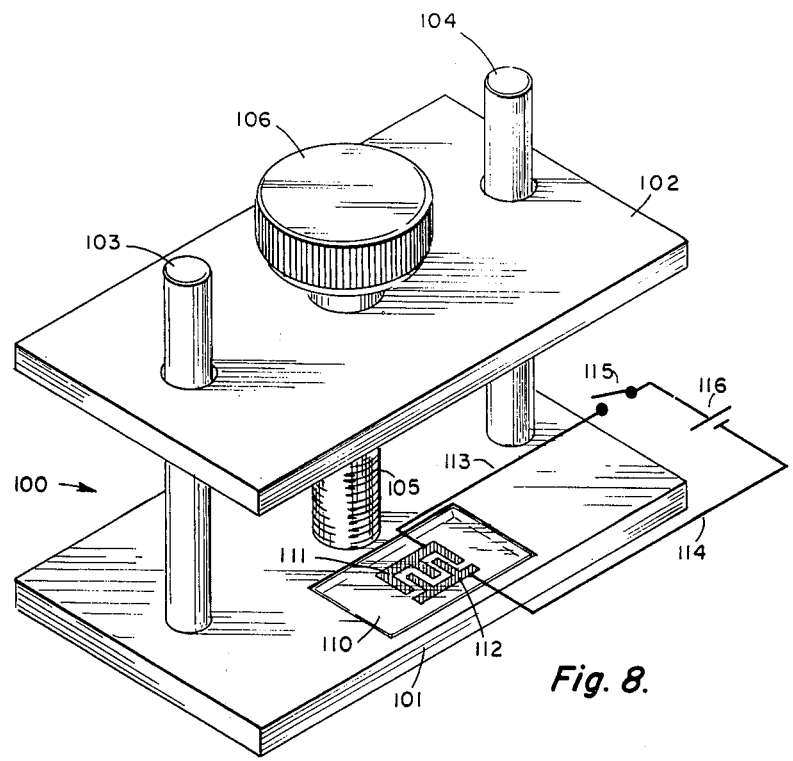
FIG. 8 is an elevational perspective view of an apparatus in accordance with the invention for applying a poling pattern to a ferroelectric substrate.

FIG. 8 illustrates an apparatus for applying a poling pattern to a ferroelectric ceramic substrate in accordance with the portion of the method shown in FIGS. 2 and 3. A press 100 is provided with a lower stationary metal plate 101 and an upper metal plate 102 which is vertically slidable on a pair of vertical support bars 103 and 104. The spacing between the plates 101 and 102 is adjustable by a conventional mechanism consisting of a bolt 105 and a thumbscrew 106. The thumbscrew is rotatably secured in the plate 102 and can be turned to adjust the height of plate 102 as desired. Mounted in a recess in the bottom plate 101 is a glass slide 110 having a pair of interdigitated metal comb electrodes 111 and 112 on the top surface thereof. These electrodes may be formed beforehand by conventional photolithographic techniques. For example, a layer of chromium can be deposited uniformly on a surface of slide 110 by sputtering. A masking layer is then applied over the chromium layer, such as by selectively exposing photoresist through an optical mask having the shape of the desired electrodes. The chromium layer can then be selectively etched to leave the electrode pattern whereupon the masking layer is removed. A pair of leads 113 and 114 are attached to the electrodes 111 and 112, respectively, and these leads are coupled, via switch 115, across a source of D.C. voltage 116.

In operation, a wafer of unpolarized ferroelectric ceramic material is mounted (by means not shown) under the top plate 102 and the thumbscrew 106 is tightened until the undersurface of the wafer is in contact with the electrodes. The switch 115 is then closed and, preferably, the press 100 is placed in an oven so that the wafer is heated during application of the poling voltage. In an actual experiment a 5 millimeter thick wafer of lead zirconate titanate was mounted in contact with the interdigitated electrodes and was heated at about 80°C for about 12 hours while the poling field of 20 kV/cm. was applied to the electrodes. The electrodes were then removed and plate and bottom electrodes were deposited as illustrated in FIG. 4. The resultant transducer was capable of establishing a surface elastic wave in the ceramic wafer by application of a suitable A.C. voltage across the electrodes. Also, a surface wave established in the ceramic (by other means) was found to result in a measurable voltage across the electrodes. Relatively high voltages can be applied across the plate and bottom electrodes since the electric field is essentially confined to the ceramic material, unlike the case where operating voltages are applied to interdigitated electrodes.

It will be understood that numerous variations of the apparatus 100 are possible within the spirit of the invention. For example, the wafer could be laid directly on the slide and then held in place by the upper plate 102. Alternatively, the electrodes could be mounted on the upper plate. Also, various means could be provided for registering the electrodes with a particular location on the wafer or substrate. Chromium is found to be a durable electrode material that can be used over and over again for poling, but other suitable metals could be employed. After poling, the plate electrode can be deposited by any known means, such as sputtering through a simple mask aperture.

Figure 9:
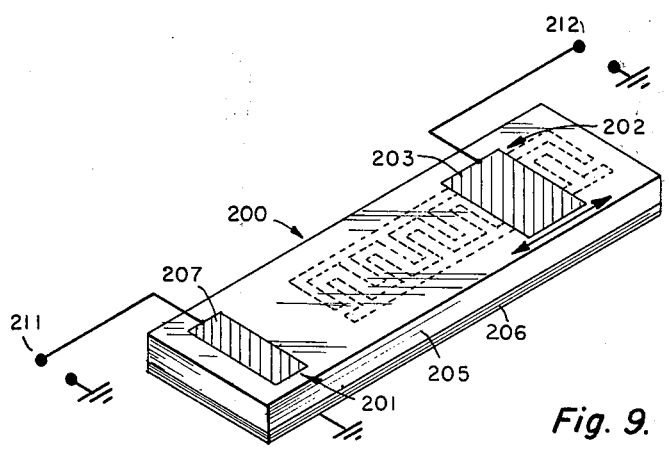
FIG. 9 is an elevational perspective view of a variable delay device in accordance with the invention.

The transducer of the present invention is particularly well suited for utilization in a variable delay device of the type shown in FIG. 9. The device 200 of FIG. 9 includes a first wave generating transducer 201 which may be of the construction shown in FIG. 4. The wave receiving transducer 202 in this device includes a metal plate 203 that is slidably mounted over a region that has a substantially sinusoidal poling pattern formed in the unpoled ferroelectric substrate 205. The pattern is obtained in the manner previously described and dotted lines indicate the positions that were occupied by electrodes during poling. As before, a metal electrode 206 is disposed over the underside of the substrate 205 and is coupled to ground reference potential. An input terminal 211 is coupled to the plate electrode 207 of transducer 201 and an output terminal 212 is coupled to the slidable electrode 203.

Operation of the device 200 is similar to that of the device of FIG. 4. Specifically, when an A.C. voltage is applied at terminal 211 (with respect to ground) a surface elastic wave is generated under plate electrode 207. This wave is received under the plate electrode 203 where it is transduced back to an electrical signal. The delay time depends on the propagation velocity of the surface wave and is a function of the distance between the transducers. This distance can be changed to vary the delay, as desired. Also, the functions of the two transducers could be reversed so that transducer 201 acts as a receiver of waves generated at transducer 202.

I claim:

1. A method of producing a surface wave transducer of a ferroelectric ceramic substrate comprising the steps of:
    a. applying a pair of interdigitated metal electrodes to a surface of said substrate;
    b. applying a poling potential between said electrodes;
    c. removing the electrodes;
    d. applying a metal plate electrode over the region where said electrodes had been applied; and
    e. applying an electrode on the opposite surface of said substrate.

2. The method as defined by claim 1 comprising the additional step of heating said substrate during application of said poling potential.

3. The method as defined by claim 1 wherein the step of applying a poling potential comprises applying a fixture in contact with said surface, said fixture including first and second comb-shaped electrodes having interdigital fingers.

4. An apparatus for selectively poling a surface of a ferroelectric ceramic substrate, comprising:
    an interdigitated fixture which includes first and second flat comb-shaped electrodes having interdigital fingers;
    means for mounting the substrate so that said surface is in spaced relation to said fixture electrodes;
    means for effecting movement as between said fixture and said mounting means so that said electrodes can be moved into and out of contact with said surface; and
    means for applying a voltage across said first and second electrodes.

5. An apparatus as defined by claim 4 wherein said interdigitated fixture comprises a glass plate having first and second metal electrodes thereon.

* * * * *